United States Patent
Chen et al.

(10) Patent No.: US 9,064,601 B2
(45) Date of Patent: Jun. 23, 2015

(54) METHOD OF PROVIDING WRITE RECOVERY PROTECTION IN PSRAM AND RELATED DEVICE

(75) Inventors: Ho-Yin Chen, Hsinchu County (TW); Chih-Huei Hu, Miaoli County (TW); Yu-Hui Sung, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 195 days.

(21) Appl. No.: 13/572,691

(22) Filed: Aug. 12, 2012

(65) Prior Publication Data
US 2014/0043922 A1    Feb. 13, 2014

(51) Int. Cl.
*G11C 7/00*     (2006.01)
*G11C 11/406*     (2006.01)
*G11C 11/4076*     (2006.01)

(52) U.S. Cl.
CPC ...... *G11C 11/40615* (2013.01); *G11C 11/4076* (2013.01)

(58) Field of Classification Search
CPC ............... G11C 11/40615; G11C 11/4076
USPC ............... 365/189.16, 222, 233.5, 185.11
See application file for complete search history.

(56) References Cited

U.S. PATENT DOCUMENTS

| 4,984,208 | A | * | 1/1991 | Sawada et al. | 365/189.14 |
| 2002/0085418 | A1 | * | 7/2002 | Goto et al. | 365/185.11 |
| 2005/0068843 | A1 | * | 3/2005 | Takeuchi | 365/233.5 |

* cited by examiner

*Primary Examiner* — Richard Elms
*Assistant Examiner* — Mohammed A Bashar
(74) *Attorney, Agent, or Firm* — Winston Hsu; Scott Margo

(57) ABSTRACT

A method of operating a PSRAM includes selecting a bit on a word line of the PSRAM, keeping the word line on for a first predetermined duration after selecting the bit, writing a data into the bit in response to a write command, and keeping the word line on for a second predetermined duration after the write command ends.

4 Claims, 2 Drawing Sheets

METHOD OF PROVIDING WRITE RECOVERY PROTECTION IN PSRAM AND RELATED DEVICE

BACKGROUND OF THE INVENTION

1. Field of the Invention

The present invention is related to a method of operating a PSRAM and related device, and more particularly, to a method of providing write recovery in a PSRAM and related device.

2. Description of the Prior Art

Random access memory (RAM) is a form of computer data storage. There are two main types of RAM: static RAM (SRAM) and dynamic RAM (DRAM). In DRAM, memory cells are essentially made up of a transistor and capacitor pair. The capacitor holds a high or low charge, and the transistor acts as a switch to allow the control circuitry on the chip to access or change the capacitor's state. Data are stored in the DRAM memory cells in the form of electric charges which need to be periodically refreshed. In SRAM, memory cells store data using flip-flops which do not need to be refreshed, thereby providing faster access time. However, an SRAM device generally is larger in size and consumes more power than a DRAM device.

A pseudo-static RAM (PSRAM) internally uses a cell structure of DRAM and is externally similar to SRAM, thereby combining the higher density of DRAM with the simpler control of SRAM. Refresh operation is also needed to prevent loss of data stored in memory cells. Awaiting period is required for writing a last bit of data into a PSRAM before issuing a precharge command and after a write cycle. Such waiting period is known as the write recovery time.

In the prior art PSRAM, a protection scheme is provided after a bit of a word line is selected for a write command. If the PSRAM is performing a dummy read before receiving the write command, the word line remains on for improving performance. However, the prior art protection scheme may fail to provide a sufficient write recovery time under such circumstance.

SUMMARY OF THE INVENTION

The present invention provides a method of providing write recovery protection in a PSRAM. The method includes selecting a bit on a word line of the PSRAM; keeping the word line on for a first predetermined duration after selecting the bit; writing a data into the bit in response to a write command; and keeping the word line on for a second predetermined duration after the write command ends.

The present invention also provides a PSRAM memory device with write recovery protection. The PSRAM memory device includes a PSRAM; a memory control circuit configured to generate a chip enable signal, a write enable signal, and a bit select signal for operating the PSRAM; a write recovery protection circuit configured to generate a protection signal which includes information of a first protection scheme associated with the bit select signal and a second protection scheme associated with the write enable signal; and a word line control circuit configured to turn on or turn off a word line according to the protection signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
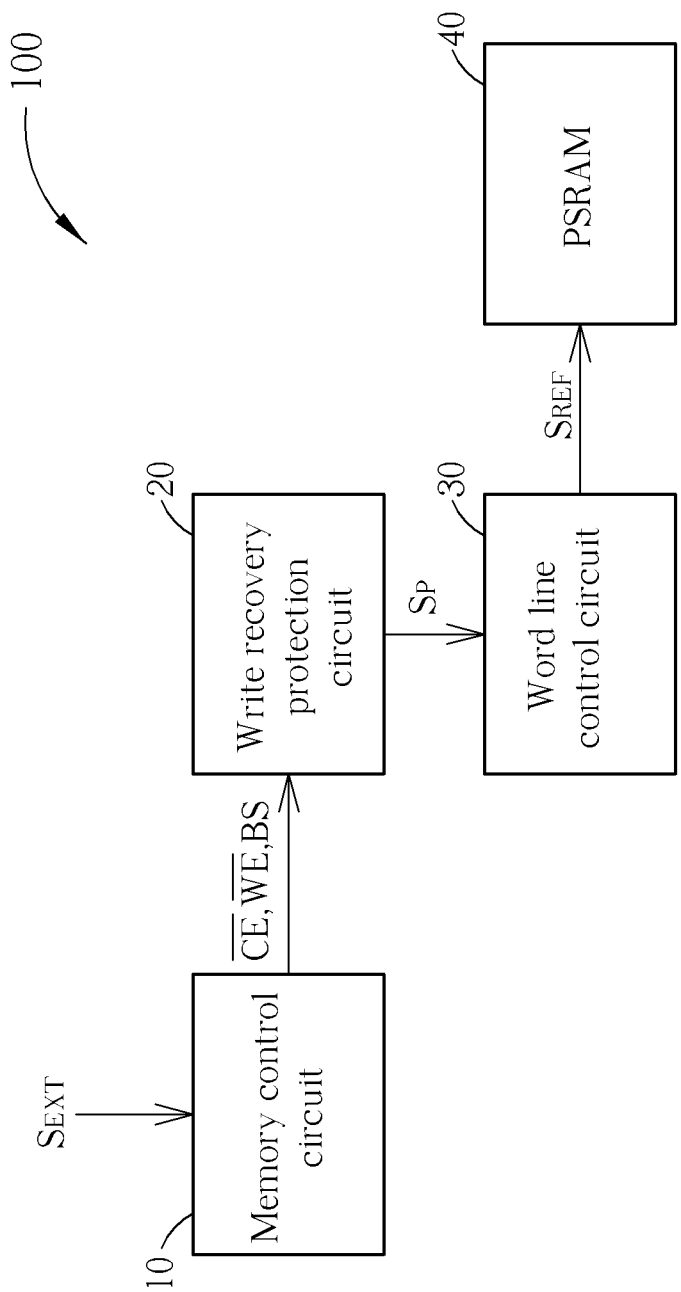
FIG. 1 is a function diagram illustrating a PSRAM memory device according to the present invention.

FIG. 1 is a function diagram illustrating a PSRAM memory device 100 according to the present invention. The PSRAM memory device 100 includes a memory control circuit 10, a write recovery protection circuit 20, a word line control circuit 30, and a PSRAM 40. The memory control circuit 10 is configured to generate control signals for operating the PSRAM 40 according to an external command $S_{EXT}$. The control signals may includes a chip enable signal $\overline{CE}$, a write enable signal $\overline{WE}$, and a bit select signal BS. As well known to those skilled in the art, the chip enable signal $\overline{CE}$ is used to block or allow input signals to the PSRAM memory device 100, the write enable signal $\overline{WE}$ is used to choose between a read and a write operation, and the bit select signal BS is used to select a bit of the PSRAM 40.

The write recovery protection circuit 20 is configured to provide a protection signal $S_p$ according to the chip enable signal $\overline{CE}$, the write enable signal $\overline{WE}$, and the bit select signal BS. The protection signal $S_p$ includes information of two protection schemes. The first protection scheme is associated with the start of a bit selecting operation, such as when the bit select signal BS goes high. The second protection scheme is associated with the end of a write operation, such as when the chip enable signal $\overline{CE}$ or the write enable signal $\overline{WE}$ goes high.

The word line control circuit 30 is configured to turn on or off a specific word line of the PSRAM 40 according to the protection signal $S_p$.

Figure 2:
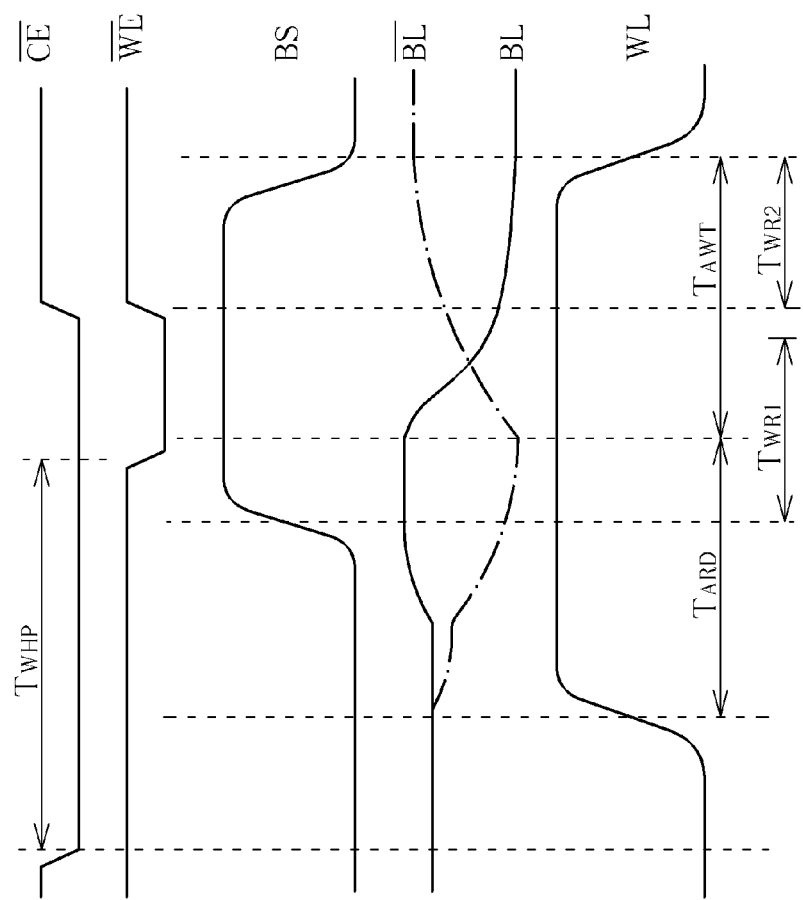
FIG. 2 is a signal diagram illustrating the operation of the PSRAM memory device according to the present invention.

FIG. 2 is a signal diagram illustrating the operation of the PSRAM memory device 100 according to the present invention. In FIG. 2, WL represents the level of a specific word line, and BL/$\overline{BL}$ represent the level of a specific bit line pair. When the chip enable signal $\overline{CE}$ is high, input signals applied to the PSRAM memory device 100 are ignored; when the chip enable signal $\overline{CE}$ is low, input signals may be applied to the PSRAM memory device 100. When the write enable signal $\overline{WE}$ is high, the PSRAM 40 is configured to perform a read operation; when the write enable signal $\overline{WE}$ is low, the PSRAM 40 is configured to perform a write operation. $T_{WHP}$ is the high pulse width of the write enable signal $\overline{WE}$ after the chip enable signal $\overline{CE}$ goes low. $T_{ARD}$ is the period when the PSRAM 40 operates in asynchronous read mode. $T_{AWT}$ is the period when the PSRAM 40 operates in asynchronous write mode. $T_{WR1}$ represents the duration of the first protection scheme. $T_{WR2}$ represents the duration of the second protection scheme.

After the specific word line is turned on, the PSRAM 40 enters asynchronous read mode before the write enable signal $\overline{WE}$ goes low. Bit selection starts after the bit select signal BS goes high, which is the start of the first protection scheme $T_{WR1}$. For exiting asynchronous write mode, the write enable signal $\overline{WE}$ goes high, which is the start of the second protection scheme $T_{WR2}$. In other words, the present invention keeps the specific word line on for a predetermined duration so as to guarantee a sufficient write recovery time.

In the embodiment illustrated in FIG. 2, the PSRAM 40 switches to asynchronous write mode before completing a dummy read operation in asynchronous read mode. Under such circumstance, both the first protection scheme $T_{WR1}$ and the second protection scheme $T_{WR2}$ are activated.

In another embodiment when $T_{WHP}$ is very short, the PSRAM 40 may enter asynchronous write mode without entering asynchronous read mode. Under such circumstance, only the first protection scheme $T_{WR1}$ is activated.

In yet another embodiment when $T_{WHP}$ is very long, the PSRAM 40 may complete a dummy read operation in asynchronous read mode before entering asynchronous write mode. Under such circumstance, only the first protection scheme $T_{WR1}$ is activated.

The present invention provides a PSRAM device with an improved write recovery protection. The two protection schemes may guarantee a sufficient write recovery time when switching between read/write operations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of providing write recovery protection in a pseudo-static random access memory (PSRAM), comprising:
    selecting a bit on a word line of the PSRAM;
    keeping the word line on for a first predetermined duration after selecting the bit;
    writing a data into the bit in response to an enabled write enable signal, wherein the enabled write enable signal corresponds to a write operation; and
    keeping the word line on for a second predetermined duration after the enabled write enable signal ends;
    wherein a sum of the first predetermined duration and the second predetermined duration forms a predetermined duration, a start of the predetermined duration leads start of the enabled write enable signal and an end of the predetermined duration lags an end of the enabled write enable signal, and the predetermined duration is used for making a length of the word line on be greater than a length of the enabled write enable signal to provide a sufficient write recovery time for the enabled write enable signal when the PSRAM performs the write operation.

2. The method of claim 1, further comprising:
    turning on the word line before receiving the enabled write enable signal.

3. A PSRAM memory device with write recovery protection, comprising:
    a PSRAM;
    a memory control circuit configured to generate a chip enable signal, a write enable signal, and a bit select signal for operating the PSRAM, wherein when the write enable signal is enabled, the enabled write enable signal corresponds to a write operation;
    a write recovery protection circuit configured to generate a protection signal which includes information of a first protection scheme associated with the bit select signal and a second protection scheme associated with the enabled write enable signal, wherein the first protection scheme corresponds to a first predetermined duration, the second protection scheme corresponds to a second predetermined duration, and a sum of the first predetermined duration and the second predetermined duration forms a predetermined duration, wherein a start of the predetermined duration leads start of the enabled write enable signal and an end of the predetermined duration lags an end of the enabled write enable signal, and the predetermined duration is used for making a length of a word line on be greater than a length of the enabled write enable signal to provide a sufficient write recovery time for the enabled write enable signal when the PSRAM performs the write operation; and
    a word line control circuit configured to turn on or turn off the word line according to the protection signal.

4. The PSRAM memory device of claim 3, wherein the word line control circuit is configured to:
    keeping the word line on for the first predetermined duration after selecting a bit on the word line according to the bit select signal; and
    keeping the word line on for the second predetermined duration after the write operation ends according to the chip enable signal or the enabled write enable signal.

* * * * *